(12) United States Patent
Hsin Chen (10) Patent No.: US 7,381,996 B2
(45) Date of Patent: Jun. 3, 2008

(54) LOW THERMAL RESISTANCE LED PACKAGE

(75) Inventor: Chen-Lun Hsin Chen, 3F., No.21, Alley 15, Bainian 2nd St., Longtime, Tauyuan (CN)

(73) Assignee: Chen-Lun Hsin Chen, Tauyuan (TW)

( * ) Notice: Subject to any disclaimer, the term of this patent is extended or adjusted under 35 U.S.C. 154(b) by 486 days.

(21) Appl. No.: 11/199,708

(22) Filed: Aug. 10, 2005

(65) Prior Publication Data
US 2006/0091410 A1  May 4, 2006

(30) Foreign Application Priority Data
Nov. 3, 2004  (TW) .............................. 93133577 A (51) Int. Cl.
*H01L 33/00* (2006.01)

(52) U.S. Cl. ........................ 257/100; 257/678; 257/687
(58) Field of Classification Search ................ 257/100, 257/678, 687
See application file for complete search history.

(56) References Cited

U.S. PATENT DOCUMENTS 7,276,739 B2 * 10/2007 Chen et al. .................... 257/99

* cited by examiner

*Primary Examiner*—Long Pham
(74) *Attorney, Agent, or Firm*—H. C. Lin Patent Agent (57) ABSTRACT

A LED chip is bonded on a large submount serving as a heat sink. The submount is punched out from a thin metal sheet together with two other sections of lead frames for the LED and held together with insulating material. The planar structure makes the package thin. A transparent lens may be mounted over the submount. More than one LED of same or different color can be mounted on the submount.

20 Claims, 9 Drawing Sheets

LOW THERMAL RESISTANCE LED PACKAGE

BACKGROUND OF THE INVENTION

1. Field of the Invention

This invention relates to light emitting diodes (LED), particularly to the packaging of LED for low thermal resistance.

2. Brief Description of Related Art

Figure 1:
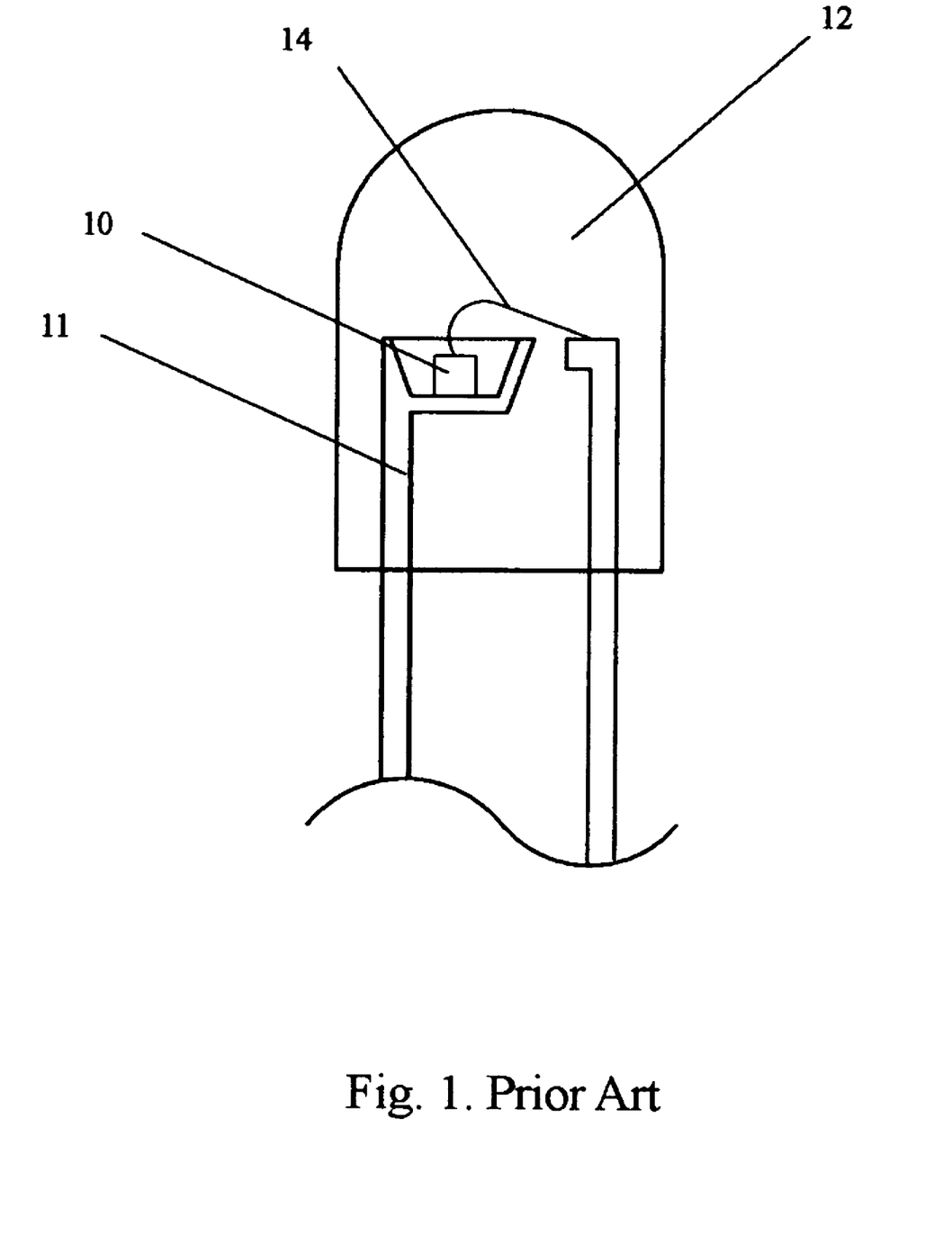
FIG. 1 shows a first prior art LED package.

A traditional LED package is shown in FIG. 1. A LED chip 10 is mounted in a recess of a lead frame 11. The recess reflects the light emitted from the LED chip 10. The LED 10 is wire bonded with a gold wire or an aluminum wire 14 to another lead frame 11 to serve as a second terminal for the LED 10. The LED 10 is coated with transparent glue, leaving only the leads exposed for external connection. Such a LED package is widely used for traffic signal lights, signal lights in a car, and indicators in an electronic production line.

Figure 2:
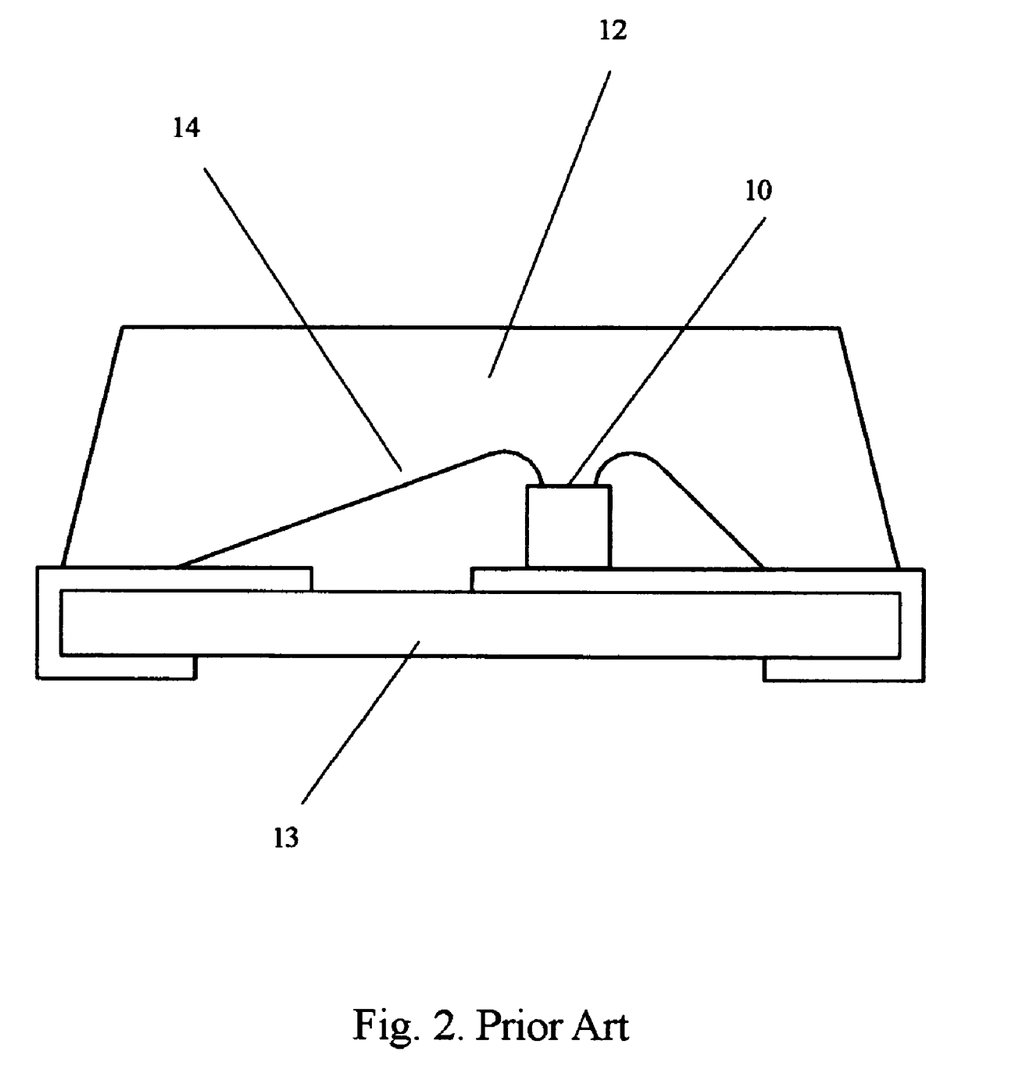
FIG. 2 shows a second prior art LED package.

Another prior art is shown in FIG. 2. A LED chip 10 is mounted on a printed circuit board 13, and is wire bonded with gold or aluminum wire 14 to surface contact leads of the printed circuit board. The structure is covered with transparent glue 12. Phosphorescent powder may be added to the glue to produce white light.

The forgoing structures have the shortcoming that the chip is coupled with bonded wires. Such bonding wires all have some degree of pliancy and strength, and widely used for semiconductor packaging. Due to the high price of gold, the cost is substantial in production. In consideration of the area and light transmission, the bonding wire is usually limited to 0.8 to 1.5 mils in diameter. The stress, which such wires can withstand, is limited, especially for the currently popular solderless bonding. The stress produced by the solderless bonding causes higher temperature at the bond, which, in turn, may cause breakage. It is therefore desirable to eliminate the use of bonding wire.

These two structures all have the drawback that the thermal resistance is excessive. Since the chip is a source of heat. When heating sinking is inadequate, the LED chip temperature rises, shortens the life of the LED, reduces the brightness of the light, and even causes the light source to be ineffective. Therefore, the heat removal or heat sinking of the LED is an important consideration for the LED package.

In general, the heat sinking property of a LED package is determined by its thermal resistance. Since the heat source of the package is solely from the LED chip, we often use the path from the P-N junction of the LED to the package lead to define the thermal resistance $R\theta_{J-P}$. It is the thermal resistance from the junction to the lead pin. Mathematically, $$R\theta_{J-P} = (T_J - T_P)/Q$$

where $T_J$ is the light emitting diode junction temperature,
$T_P$ is the lead line temperature,
Q is the heat flux.

Since the light emitting diode chip is the sole source of heat generation, and only a negligible amount of this energy is radiated as electromagnetic waves, the bulk of the energy is transformed into heat. Thus the thermal-resistance formula can be rewritten as:

$$R\theta_{J-P} = (T_J - T_P)/(I_f \cdot V_f)$$

where $I_f$ is the operating current of the LED and $V_f$ is the operating voltage.

Since the pin temperature is determined by the ambient temperature of the system and is not affected by the heat sinking property of the LED, one can see from the foregoing formula that the junction temperature increases with increasing thermal resistance.

From the standpoint of conduction heat transfer, the thermal resistance can be expressed as:

$$R\theta = L/(K \times A),$$

where L is the length of the heat conduction path, K is the thermal conductivity coefficient, and A is cross-sectional area of the heat conduction path.

Thus, we can see that the longer the heat conduction path, the larger the cross-sectional area and lower the thermal conductivity coefficient, the higher is the thermal resistance. Therefore, for low thermal resistance design, it is important to shorten the heat conduction path, to increase its cross-sectional area and to select a material with high thermal conductivity coefficient.

Figure 3:
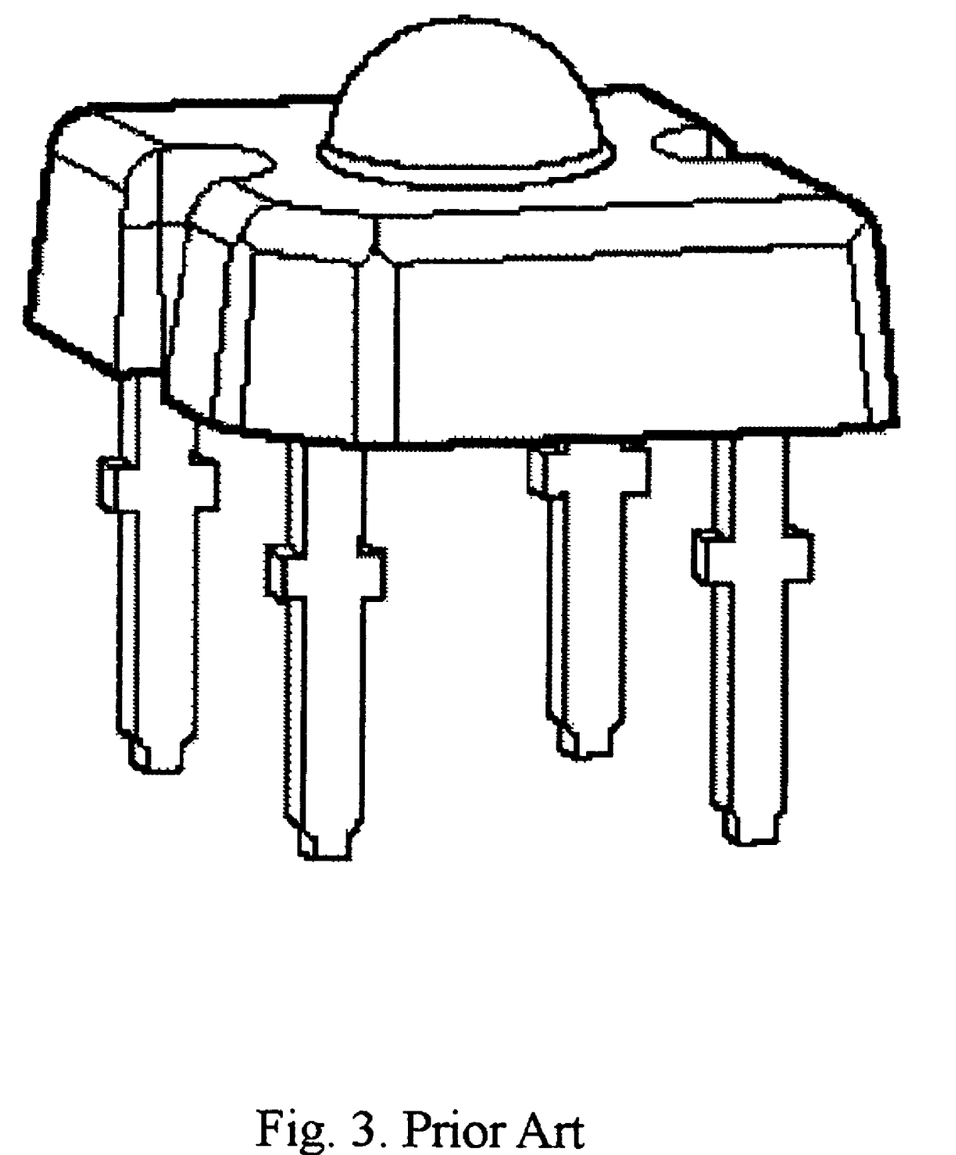
FIG. 3 shows a third prior art LED package.

The foregoing two prior art LED packages essentially dissipate the heat through the lead frame or the printed circuit board. The printed circuit board shown in prior art FIG. 2 is made of plastic material, which has a very low thermal conductivity coefficient, and is incapable of dissipating heat. The printed copper wire on the circuit board has only a thickness of tens and hundreds um with small cross-sectional area. Hence, the thermal resistance is very high, ranging 500-1000° C./Watt. When the energy is high, the LED can easily be overheated. Fir the prior art described in FIG. 1, the heat path through the support frame of copper or iron. Although the heat conductivity coefficient is good, the cross-sectional area is still very small, ranging 150-250° C./W. Thus the load current can only be approximately 30 mA To remedy this problem, other approaches have been suggested. FIG. 3 shows a design with enlarged pins to reduce the thermal resistance. However, the conduction path is long and can only achieve a thermal resistance of 50-75° C./W.

Figure 4:
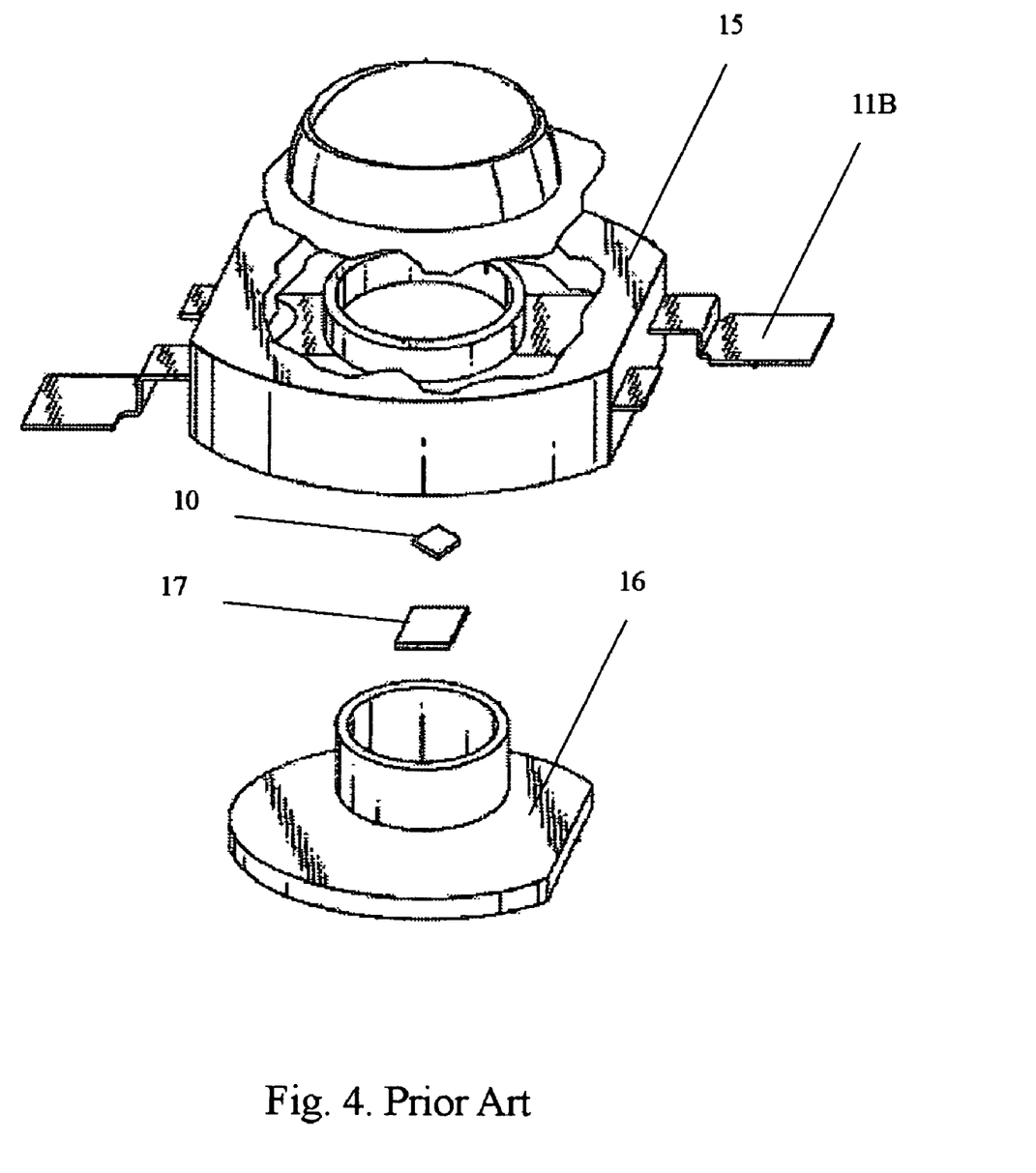
FIG. 4 shows a fourth prior art LED package.

Another invention disclosed in U.S. Pat. No. 6,274,924 and shown in FIG. 4. A set of lead frame 11 (not referenced in the figure) is imbedded in an insulating mold 15. Inside the mold 15 is a conduit which has an enlarged flange 16 serving a heat sink. The LED chip 10 is mounted on a submount 17 which is attached to the heat sink, serving as the lead for the bottom electrode. The top electrode of the LED is wire bonded to the another lead frame. The heat sink reduces the heat conduction path and enlarges the cross-sectional area to reduce the thermal resistance to 10-15° C./W. However, from a production stand point, the additional heat sink increases the production processing step and the height of the package. Another problem is that when large LED chips are used, the packaging area need to be increased. An increase in packaging area increases the stress caused by different expansion coefficients, and the danger of breaking the bonding wire also increases.

SUMMARY OF THE INVENTION

An object of this invention is to reduce the thermal resistance of a LED package. Another object of this invention is to reduce the production cost of LED package by reducing the thickness of the package.

These objects are achieved by etching a thin sheet of metal into three sections: a submount 20 for a LED chip 10, and two lead frames 18, 19 as terminals of the LED. These three sections are held together with an insulating cup 15. The LED chip 10 is mounted on the submount 20, and protrudes over the insulating cup 15. The top electrodes of the LED 10 are wire bonded by wires 14 for coupling to the positive lead frame 18 and negative lead frame 19. A transparent material is used to cover the LED 10 and bonding wires 14.

The submount 20 is a section of the overall lead frame. The thickness is much smaller than prior art, the thermal resistance is much lower, and the process is simpler in that the extra step to insert a heat sink is eliminated. Although the instantaneous temperature rise is quicker, the final temperature is the same.

Another provision of the present invention is the installation of a highly transparent lens 22. The lens can be fabricated with resin, silicon, glass, Teflon, their composite or any other transparent material. The lens can reduce total internal reflection to increase luminance, and can change light pattern to satisfy different optical requirements.

The present invention can be adapted to multiple number of LEDs. The electrical connections can be series or parallel with common negative terminal. The structure can accommodate same color LEDs to increase light intensity, or different color LEDs to produce color patterns.

DETAIL DESCRIPTION OF THE INVENTION

Figure 5:
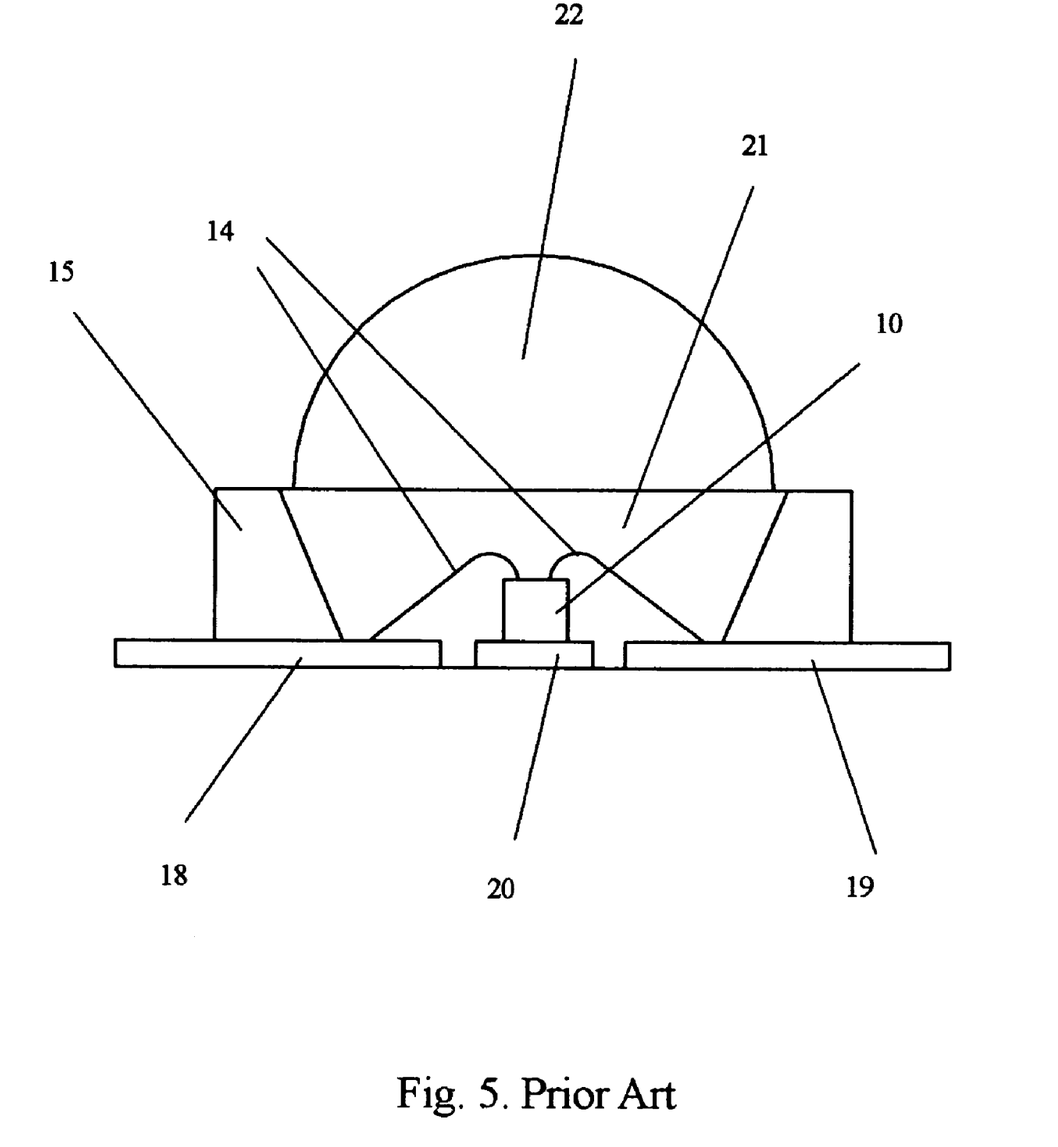
FIG. 5 shows a fifth prior art LED package.

The basic LED package of the present invention is shown in FIG. 5. A 0.5 mm thick metal sheet is punched out into three isolated sections: a positive lead frame 18, a negative lead frame 19 and a submount 20 for a LED chip 10. A glue 15 is used to bind the three sections together and to form a cup with portions of the lead frame 18, 19 and the top of the submount 20 exposed. The LED chip 10 is mounted on the submount with bonding material with conductivity greater than 1 W/m-° C., and wire bonded with bonding wires 14 separately to the positive lead frame 18 and negative lead frame 19. Silicone 21 is used to fill the cup so as cover the LED chip 10 and to protect the bonding wires 14. The silicone 21 should have a refractive index greater than 1.3 and transmission coefficient greater than 70%. A transparent lens is mounted over the silicone 21. The lens is fabricated with transparent material such as resin, glass, silicon glue, Teflon or their composite with transmission coefficient greater than 70%.

Figure 6:
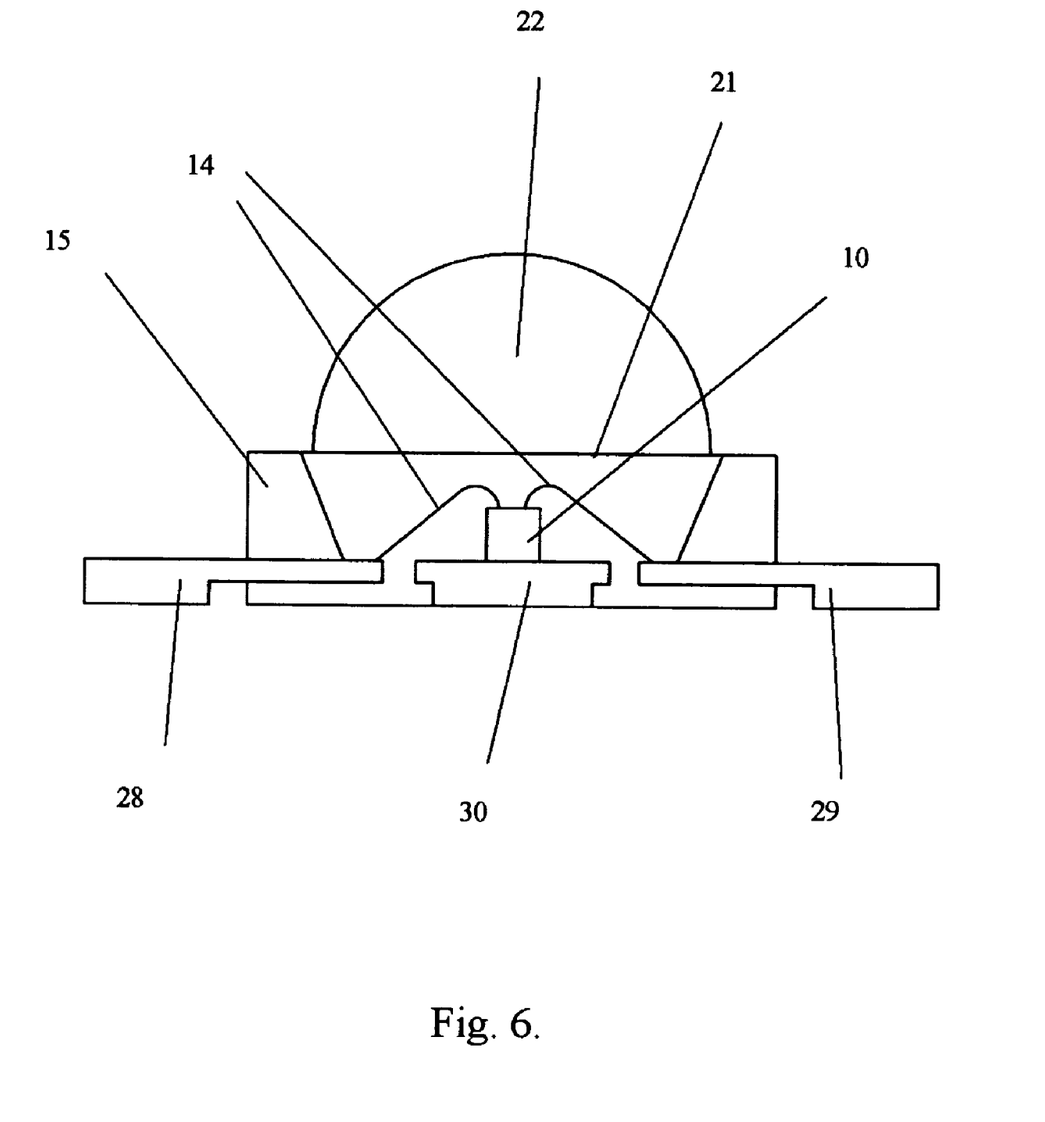
FIG. 6 shows the basic structure of the LED package of the present invention.

FIG. 6 shows a second embodiment of the present invention. The structure is similar to that in FIG. 5, except that the three 0.5 mm metal sections are further half-etched from the bottom to from a positive lead frame 28, a negative lead frame 29 and a LED chip submount 30. The half-etched sections 28, 29 and 30 let the binding glue 15 to flow under half-etched sections to solidify the structure. Other elements with same reference numerals correspond to the same functions as that in FIG. 5.

Figure 7:
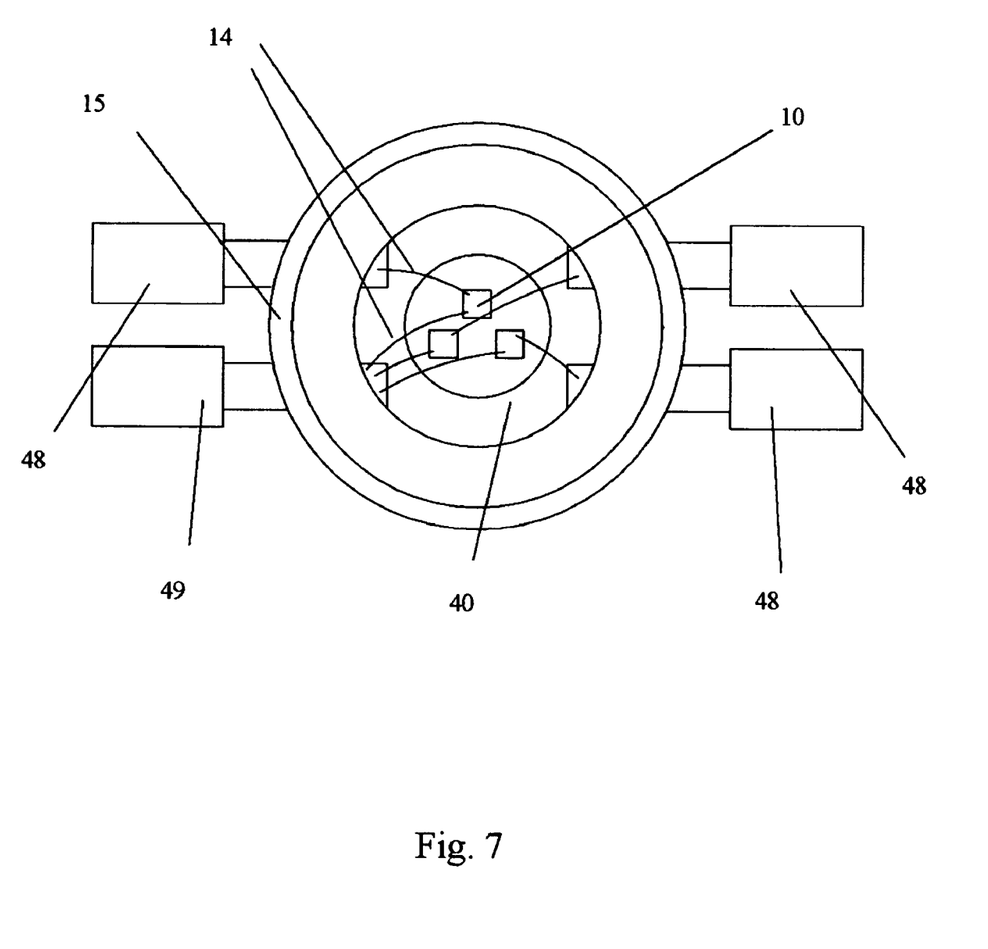
FIG. 7 shows a second embodiment of the present invention.
Figure 8:
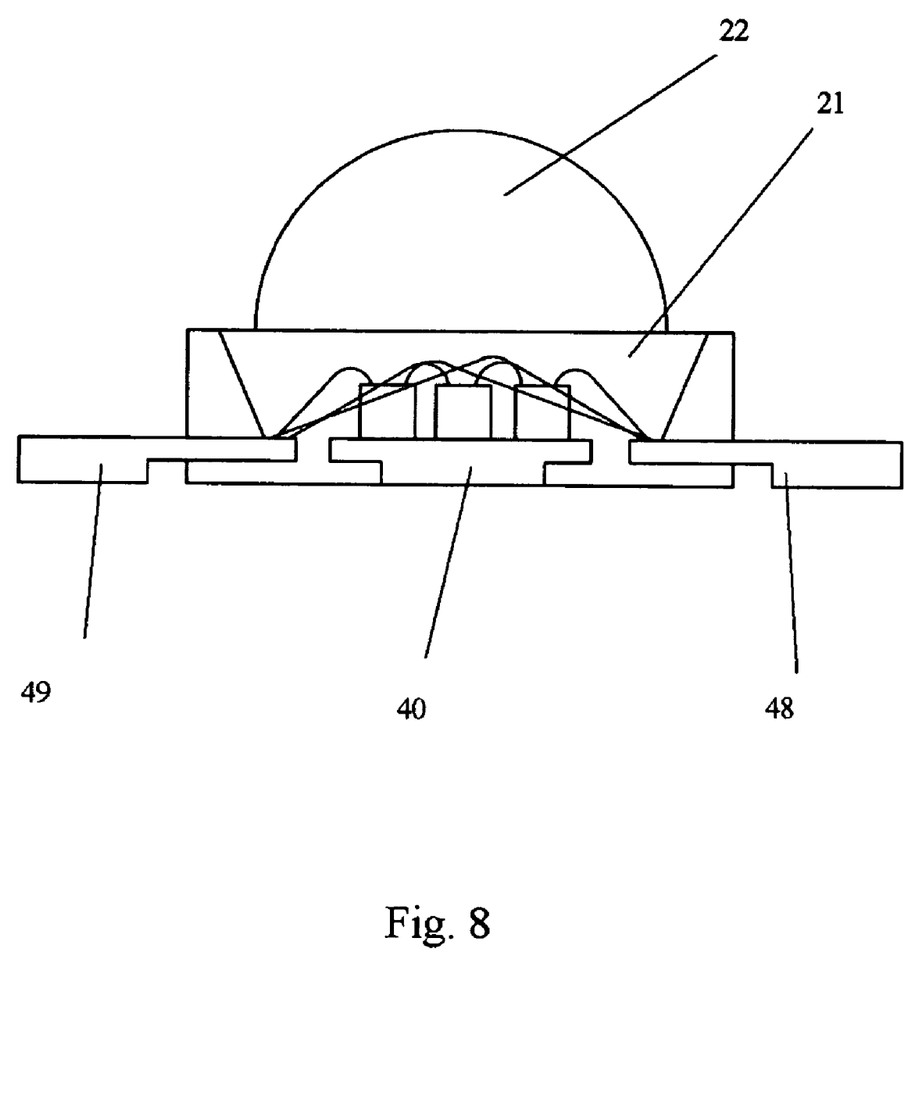
FIG. 8 shows a third embodiment of the present invention.

FIG. 7 shows a third embodiment of the present invention. A 0.5 mm thick metal sheet is punched out into five isolated sections: three positive lead frames 48, a negative lead frame 49, and a submount 40 for three color LEDs 10 which emit red, green and blue color lights. A glue is used to bind the five sections together and to form a cup with portions of the lead frames 48, lead 49 and the top of the submount 40 exposed, as shown in the cross-sectional view FIG. 8. The three LED chips 10 are mounted on the submount 40 and wire bonded with bonding wires 14 to respective positive lead frames 48 and common negative lead frame 49. Otherwise, the structure is similar to that in FIG. 6. Silicone 21 is used to fill the cup so as to cover and LED chips 10 and to protect the bonding wires 14. A convex lens is mounted over the silicone 21.

Figure 9:
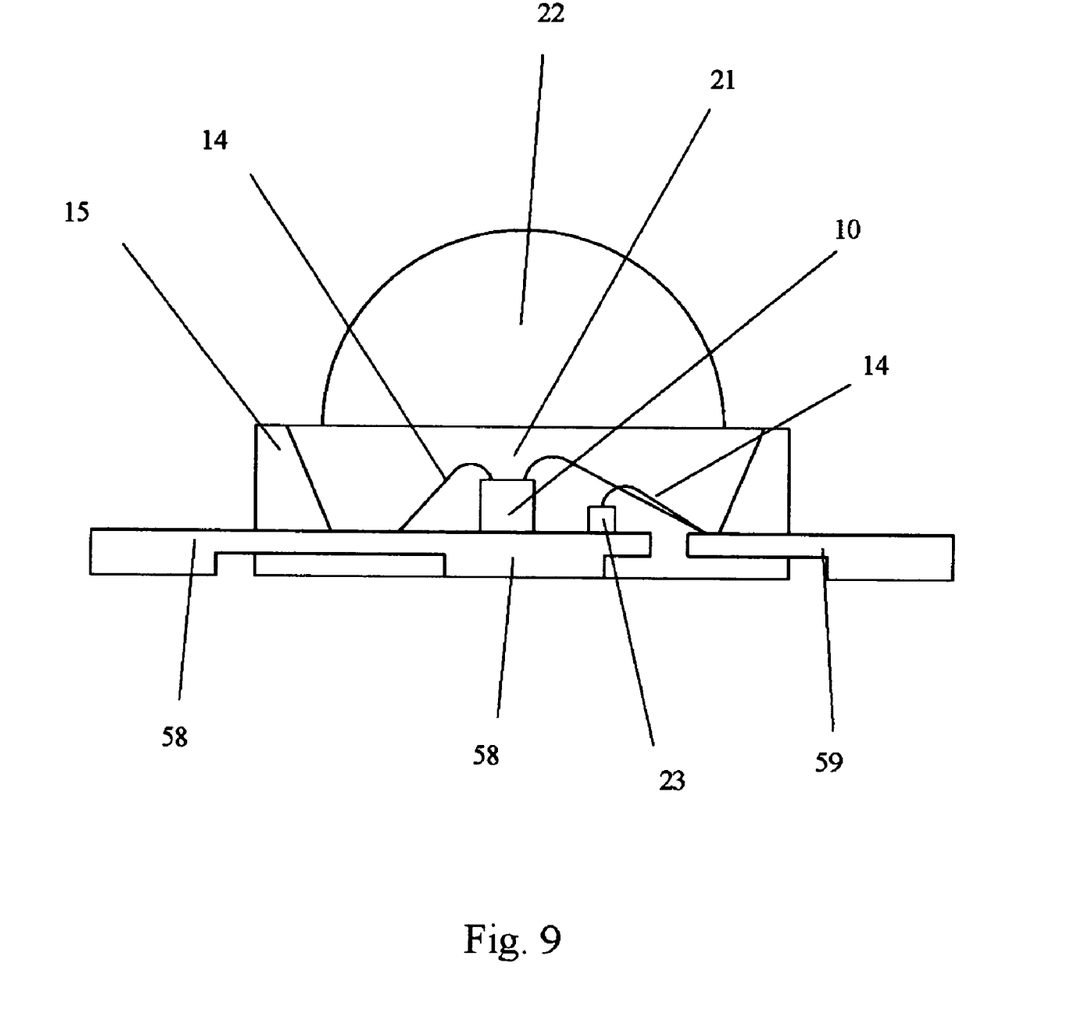
FIG. 9 shows a fourth embodiment of the present invention.

FIG. 9 shows a fourth embodiment of the present invention. The structure is similar to that in FIG. 6 except that a back-to-back Zener diode 23 has been added for electric static protection. In this FIG. 8, the lead frame 58 corresponds to lead frame 28 in FIG. 6; lead frame 59 corresponds to lead frame 29; and lead frame 58 also corresponds to lead frame 30 in FIG. 6 in that this positive lead frame also serves as a connection to a terminal for the Zener diode 23. The other terminal of the Zener diode 23 is wire bonded to lead frame 59. Thus the Zener diode 23 is connected in parallel with the LED 10. The elements with the same numerals correspond to the same functions as that in FIG. 6.

The invention claimed is:

1. A low thermal resistance light emitting diode (LED) package, comprising:
   metal sheet less than 1.5 mm thick, divided into three isolated sections with planar top surface and planar bottom surface to form a positive lead frame, a negative lead frame and a submount for LED chip;
   an insulating material for holding said three isolated sections together with said submount protruding above and beneath the insulating material;
   at least one LED chip bonded on said submount with material with a conductivity coefficient greater than 1 W/m-° C., and wire-bonded to said positive lead frame and said negative lead frame; and
   a transparent material with index of refraction greater than 1.3 and a transmission coefficient greater than 70% covering over said LED chip.

2. The low thermal resistance LED package as described in claim 1, wherein said submount is anchored in a recess of said insulating material.

3. The low thermal resistance LED package as described in claim 1, further comprising a lens with coefficient of transmission greater than 70% mounted above said submount.

4. The low thermal resistance LED package as described in claim 3, wherein the material for said lens is selected from the group consisting of resin, glass, silicon, Teflon and their composite.

5. The low thermal resistance LED package as described in claim 1, further comprising more than one of said positive lead frame and said negative lead frame.

6. The low thermal resistance LED package as described in claim 1, further comprising more than one submount.

7. The low thermal resistance LED package as described in claim 1, further comprising static protection circuit.

8. A low thermal resistance LED package, comprising:
a metal sheet less than 1.5 mm thick, divided three isolated sections with planar top surfaces and planar bottom surfaces: forming a positive lead frame, a negative lead frame, and s submount for LED;
an insulating material for holding said three isolated sections together with said submount protruding above and beneath said insulating material;
at least one LED chip bonded on said submount and wire-bonded to said positive lead frame and said negative lead frame;
a transparent material with index of refraction greater than 1.3 and transmission coefficient greater than 70% covering over said LED.

9. The low thermal resistance LED package as described in claim 8, wherein said submount is half-etched to reduce the thickness.

10. The low thermal resistance LED package as described in claim 8, wherein a lens having a coefficient of transmission greater than 70% is mounted above said insulating material.

11. The low thermal resistance LED package as described in claim 8, wherein said lens is composed of material selected from the group consisting of: resin, glass, silicone and their composite.

12. The low thermal resistance LED package as described in claim 8, further comprising more than one said positive lead frame and said negative lead frame.

13. The low thermal resistance LED package as described in claim 8, wherein said submount is attached to one of positive lead and negative frame.

14. The low thermal resistance LED package as described in claim 8, wherein a back-to-back Zener diode is mounted on said submount and connected in parallel with said LED.

15. A low thermal resistance LED package, comprising:
a metal sheet less than 1.5 mm thick, divided into three isolated sections with planar top surface and planar bottom surface: forming a positive lead frame, a negative lead frame and a submount for LED chip;
an insulating material for holding said submount, said positive lead frame and negative lead frame together with said submount protruding above and beneath said insulating material;
at least one LED chip bonded to said submount with material with conductivity coefficient greater than 1 W/m–° C.;
transparent material with index of refraction greater than 1.3 and transmission coefficient greater than 70% covering said LED chip.

16. The low thermal resistance LED package as described in claim 15, wherein said submount and lead frames are half-etched to let said insulating material fill in the half-etched space.

17. The low thermal resistance LED package as described in claim 15, further comprising a lens over said LED chips with coefficient of transmission greater 70%.

18. The low thermal resistance LED package as described in claim 17, wherein the lens is fabricated with material selected from the group consisting of resin, glass, silicone, Teflon and their composite.

19. The low thermal resistance LED package as described in claim 15, further comprising more than one of said lead frames.

20. The low thermal resistance LED package as described in claim 15, further comprising a Zener diode for protection against static electricity.

* * * * *